US012559640B2

(12) United States Patent
Kim

(10) Patent No.: US 12,559,640 B2
(45) Date of Patent: Feb. 24, 2026

(54) INK COMPOSITION, LAYER PREPARED THEREFROM, AND DISPLAY APPARATUS INCLUDING THE INK COMPOSITION

(71) Applicant: Samsung Display Co., Ltd., Yongin-si (KR)

(72) Inventor: Soodong Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 184 days.

(21) Appl. No.: 18/357,844

(22) Filed: Jul. 24, 2023

(65) Prior Publication Data

US 2024/0191092 A1 Jun. 13, 2024

(30) Foreign Application Priority Data

Nov. 30, 2022 (KR) ........................ 10-2022-0165109

(51) Int. Cl.

| | |
|---|---|
| ***C09D 11/38*** | (2014.01) |
| ***C09D 11/03*** | (2014.01) |
| ***C09D 11/30*** | (2014.01) |
| ***C09D 11/322*** | (2014.01) |
| ***C09D 11/52*** | (2014.01) |
| ***C09K 11/08*** | (2006.01) |
| ***H10K 50/115*** | (2023.01) |
| ***H10K 50/15*** | (2023.01) |
| ***H10K 50/17*** | (2023.01) |
| ***H10K 50/854*** | (2023.01) |
| ***H10K 59/122*** | (2023.01) |
| ***H10K 59/38*** | (2023.01) |

(Continued)

(52) U.S. Cl.

CPC .............. *C09D 11/38* (2013.01); *C09D 11/03* (2013.01); *C09D 11/30* (2013.01); *C09D 11/322* (2013.01); *C09D 11/52* (2013.01); *C09K 11/08* (2013.01); *H10K 50/115* (2023.02); *H10K 50/15* (2023.02); *H10K 50/17* (2023.02); *H10K 50/854* (2023.02); *H10K 59/122* (2023.02); *H10K 59/38* (2023.02); *H10K 59/877* (2023.02); *C09K 11/025* (2013.01); *C09K 11/56* (2013.01); *C09K 11/62* (2013.01); *C09K 11/88* (2013.01)

(58) Field of Classification Search

CPC ......... C09D 11/38; C09D 11/03; C09D 11/30; C09D 11/322; C09D 11/52; H10K 50/15; H10K 50/17; H10K 50/854; H10K 59/122; H10K 59/38; H10K 59/877; C09K 11/56; C09K 11/62; C09K 11/88

See application file for complete search history.

(56) References Cited

U.S. PATENT DOCUMENTS 10,533,127 B2 1/2020 Park et al.
11,352,555 B2 6/2022 Park et al.
(Continued)

FOREIGN PATENT DOCUMENTS

KR 10-2019-0019863 A 2/2019
KR 10-2020-0016057 A 2/2020
(Continued)

*Primary Examiner* — Yaovi M Ameh

(74) *Attorney, Agent, or Firm* — Womble Bond Dickinson (US) LLP

(57) ABSTRACT

Provided is an ink composition including: a scatterer; and a monomer, wherein the scatterer comprises a first scatterer and a second scatterer, the first scatterer is hydrophilic, and the second scatterer is hydrophobic.

19 Claims, 8 Drawing Sheets

(51) Int. Cl.

| | |
|---|---|
| ***H10K 59/80*** | (2023.01) |
| *C09K 11/02* | (2006.01) |
| *C09K 11/56* | (2006.01) |
| *C09K 11/62* | (2006.01) |
| *C09K 11/88* | (2006.01) |

(56) References Cited

U.S. PATENT DOCUMENTS

| | | | | |
|---|---|---|---|---|
| 2019/0055465 | A1* | 2/2019 | Park | C08F 220/06 |
| 2021/0382352 | A1 | 12/2021 | Kim et al. | |
| 2022/0194969 | A1* | 6/2022 | Lee | C09K 11/02 |
| 2023/0159770 | A1 | 5/2023 | Kim et al. | |

FOREIGN PATENT DOCUMENTS

| | | | |
|---|---|---|---|
| KR | 10-2021-0153170 | A | 12/2021 |
| KR | 10-2023-0047288 | A | 4/2023 |

* cited by examiner

INK COMPOSITION, LAYER PREPARED THEREFROM, AND DISPLAY APPARATUS INCLUDING THE INK COMPOSITION

CROSS-REFERENCE TO RELATED APPLICATION

This application claims priority to and the benefit of Korean Patent Application No. 10-2022-0165109, filed on Nov. 30, 2022, in the Korean Intellectual Property Office, the entire content of which is incorporated by reference herein.

BACKGROUND

1. Field

Embodiments of the present disclosure relate to an ink composition, a layer prepared therefrom, and a display apparatus including the ink composition.

2. Description of the Related Art

A display apparatus such as an organic light-emitting display apparatus produces an image by generating light based on the principle that holes and electrons respectively injected from an anode and a cathode recombine in an emission layer to emit light. For example, a desired color is expressed by a color combination of pixels that may each emit a color (e.g., different of colors) of light.

To this end, each pixel includes a light-emitting device that may generate monochromatic light, such as white light or blue light; a quantum dot layer for controlling the monochromatic light to be converted to a desired color of light, e.g., red light, green light, or blue light, for output; and a color filter. When the light-emitting device of each pixel generates monochromatic light, the monochromatic light passes through the quantum dot layer and the color filter, and is converted into one selected from red, green, and blue color to thereby emit each color of light, thus realizing an image of a desired color by a color combination of the colors of light emitted from the pixels.

SUMMARY

Provided is an ink composition in which a bank surface is coated with a scatterer (e.g., a light scatterer) by one shot of inkjet (e.g., one drop or one deposition of an inkjet process) and a quantum dot layer or a scattering layer formed therefrom maintains a suitable or optimum concentration.

Additional aspects of embodiments will be set forth in part in the description which follows and, in part, will be apparent from the description, or may be learned by practice of the presented embodiments of the disclosure.

According to one or more embodiments, an ink composition includes:

a scatterer (e.g., a light scatterer), and a monomer, wherein the scatterer may include a first scatterer (e.g., a first light scatterer) and a second scatterer (e.g., a second light scatterer), and the first scatterer may be hydrophilic, and the second scatterer may be hydrophobic.

The first scatterer and the second scatterer may each independently be a scatterer in which a ligand-type compound (e.g., a ligand-containing compound) or a dispersant-type compound (e.g., a dispersant-containing compound) is coated on a scattering particle.

The scattering particle may include a metallic compound.

The scattering particle may include $Al_2O_3$, $SiO_2$, ZnO, $ZrO_2$, $BaTiO_3$, $TiO_2$, $Ta_2O_5$, $Ti_3O_5$, ZnO—Al, $Nb_2O_3$, SnO, MgO, $MgF_2$, or any combination thereof.

The first scatterer may be a scatterer (e.g., a light scatterer) in which a first ligand-type compound (e.g., a first ligand-containing compound) or a first dispersant-type compound (e.g., a first dispersant-containing compound) is coated on the scattering particle.

The first ligand-type compound may:

include an amine group, but not a carboxyl group;

include not an amine group, but a carboxyl group; or include both an amine group and a carboxyl group, wherein a difference between an amine value and an acid value is 5 mg KOH/g or more.

The first dispersant-type compound may include a polymer chain including a polyacrylate-based polymer, a polyurethane-based polymer, and/or a polyethylene-based polymer.

The polymer chain may:

include an amine group, but not a carboxyl group;

include not an amine group, but a carboxyl group; or include both an amine group and a carboxyl group, wherein a difference between an amine value and an acid value is 5 mg KOH/g or more.

The amine value is a converted mg value of KOH after neutralization titration of an amine group included in 1 g of the compound with HCl, and the acid value is an mg value of KOH required for neutralization titration the carboxyl group included in 1 g of the compound with KOH.

The second scatterer may be a scatterer (e.g., a light scatterer) in which a second ligand-type compound (e.g., a second ligand-containing compound) or a second dispersant-type compound (e.g., a second dispersant-containing compound) is coated on the scattering particle.

The second ligand-type compound may:

not include an amine group and a carboxyl group; or include both an amine group and a carboxyl group, wherein a difference between an amine value and an acid value is in a range of about 0 mg KOH/g to about 20 mg KOH/g.

The second dispersant-type compound may include a polymer chain including be a polyacrylate-based polymer, a polyurethane-based polymer, and/or a polyethylene-based polymer.

The polymer chain may:

not include an amine group and a carboxyl group; or include both an amine group and a carboxyl group, wherein a difference between an amine value and an acid value is in a range of about 0 mg KOH/g to about 20 mg KOH/g.

The amine value is a converted mg value of KOH after neutralization titration of an amine group included in 1 g of the compound with HCl, and the acid value is an mg value of KOH required for neutralization titration the carboxyl group included in 1 g of the compound with KOH.

A total amount of the scatterers may be in a range of about 1 wt % to about 70 wt % (based on 100 wt % of the total amount of the ink composition).

An amount of the first scatterer may be in a range of about 0.1 wt % to about 5 wt %, and an amount of the second scatterer may be in a range of about 7 wt % to about 60 wt % (based on 100 wt % of the total amount of the ink composition).

The amount of the second scatterer may be in a range of about 0.1 wt % to about 5 wt %, and the amount of the second scatterer may be in a range of about 7 wt % to about 60 wt % (based on 100 wt % of the total amount of the ink composition).

The ink composition may further include a quantum dot.

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

The Group II-VI semiconductor compound may include CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, or any combination thereof.

The Group III-V semiconductor compound may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the Group III-VI semiconductor compound may include GaS, GaSe, $GazSe_3$, GaTe, InS, InSe, $In_2S_3$, $In_2Se_3$, InTe, $InGaS_3$, $InGaSe_3$, or any combination thereof.

The Group I-III-VI semiconductor compound may include AgInS, $AgInS_2$, CuInS, $CuInS_2$, $CuGaO_2$, $AgGaO_2$, $AgAlO_2$, AgInGaS, or any combination thereof.

The Group IV-VI semiconductor compound may include SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, or any combination thereof.

The group IV element or compound may include Si, Ge, SiC, SiGe, or any combination thereof.

According to one or more embodiments, provided is a layer prepared by the ink composition.

According to one or more embodiments, a display apparatus includes:

a first substrate on which a light-emitting device may be provided, and a light controller on the first substrate and corresponding to the light-emitting device, wherein the light controller may include a quantum dot layer and/or a scattering layer, a color filter layer, and a bank, and the quantum dot layer and/or the scattering layer may be a layer prepared by the ink composition.

The light-emitting device may include:

a first electrode, a second electrode facing the first electrode, and an interlayer between the first electrode and the second electrode and including an emission layer.

The quantum dot layer and/or the scattering layer may be in contact with the bank, a surface of the bank in contact with the quantum dot layer and/or the scattering layer may be hydrophilic, and in the quantum dot layer and/or the scattering layer, an amount of the first scatterer may be in a range of about 0.1 wt % to about 5 wt %, and an amount of the second scatterer may be in a range of about 7 wt % to about 60 wt % (based on 100 wt % of the total amount of the ink composition).

The quantum dot layer and/or the scattering layer may be in contact with the bank, a surface of the bank in contact with the quantum dot layer and/or the scattering layer may be hydrophobic, and in the quantum dot layer and/or the scattering layer, the amount of the second scatterer may be in a range of about 0.1 wt % to about 5 wt %, and the amount of the first scatterer may be in a range of about 7 wt % to about 60 wt % (based on 100 wt % of the total amount of the ink composition).

The light-emitting device may include:

a first electrode, a second electrode facing the first electrode, and an interlayer between the first electrode and the second electrode and including an emission layer.

The interlayer may further include:

a hole transport region including a hole injection layer, a hole transport layer, an emission auxiliary layer, an electron blocking layer, or any combination thereof, and/or an electron transport region including a hole blocking layer, an electron transport layer, an electron injection layer, or any combination thereof.

Other aspects and features other than those described above will become apparent from the following drawings, claims, and detailed description.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
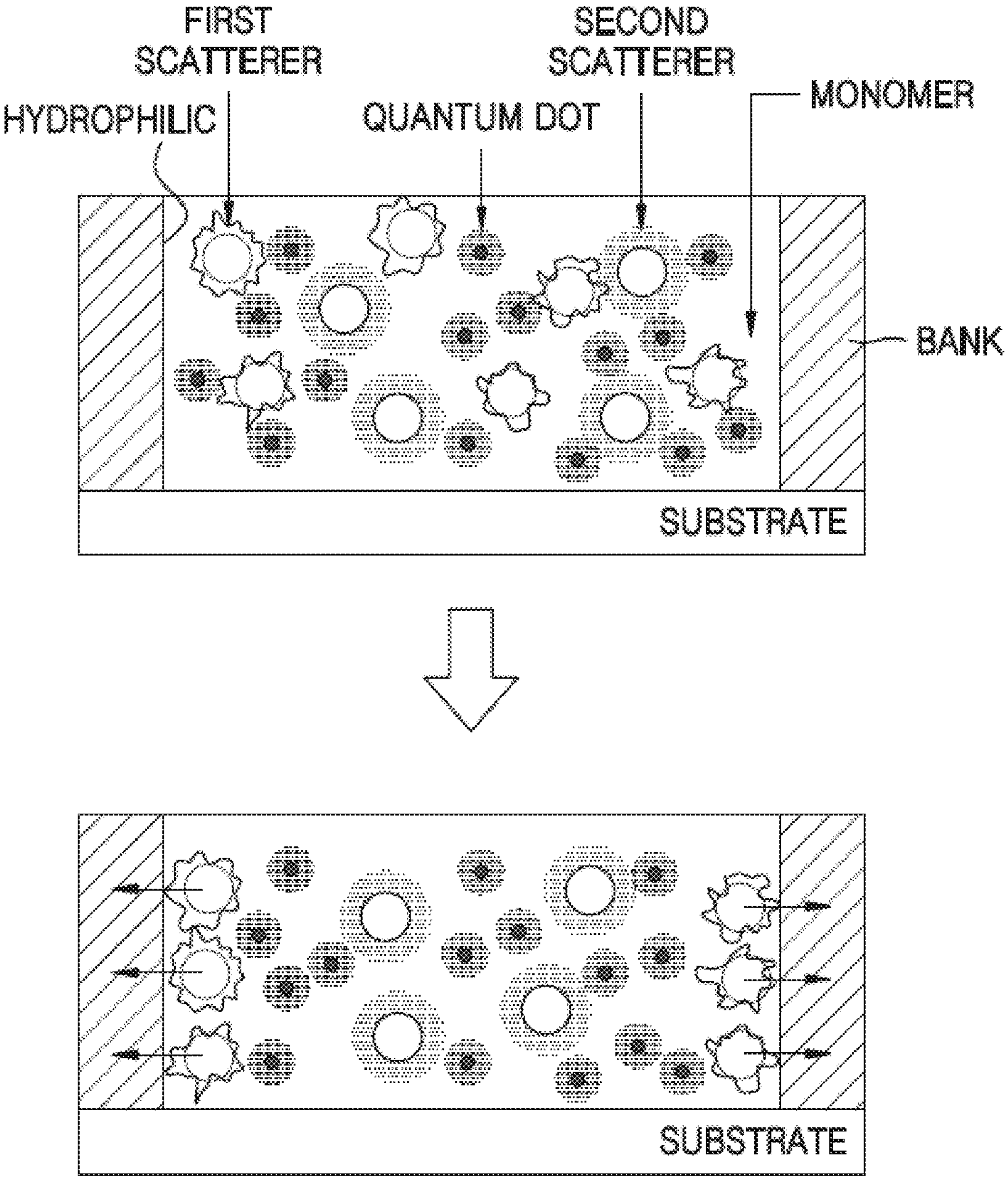
FIG. 1 is a diagram schematically illustrating interactions between; a first scatterer (e.g., a first scatterer) and a second scatterer (e.g., a second scatterer) according to an embodiment; and a bank in a quantum dot layer and/or a scattering layer after being ink-jetted.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the subject matter of the disclosure may have diverse modified embodiments, embodiments are illustrated in the drawings and are described in the detailed description. An effect and a characteristic of the subject matter of the disclosure, and a method of accomplishing these will be apparent when referring to embodiments described with reference to the drawings. The subject matter of the disclosure may, however, be embodied in many different forms and should not be construed as limited to the embodiments set forth herein.

Hereinafter, embodiments of the present disclosure will be described in more detail with reference to the accompanying drawings. The same or corresponding components will be denoted by the same reference numerals, and thus redundant description thereof may not be repeated.

It will be understood that although the terms "first," "second," etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

Sizes of elements in the drawings may be exaggerated for convenience of explanation. In other words, because sizes and thicknesses of components in the drawings may be arbitrarily illustrated for convenience of explanation, the following embodiments are not limited thereto.

When a certain embodiment is implemented differently, a set or specific process order may be performed differently from the described order. For example, two processes described in succession may be performed substantially simultaneously, or may be performed in an order opposite to the described order.

It will be understood that when a layer, region, or component is referred to as being "connected to" another layer, region, or component, the layer, region, or component may be directly connected to the another layer, region, or component, or indirectly connected to the another layer, region, or component as intervening layer, region, or component is present. For example, it will be understood that when a layer, region, or component is referred to as being "electrically connected to" another layer, region, or component, the layer, region, or component may be directly electrically connected to the another layer, region, or component, or indirectly electrically connected to the another layer, region, or component as intervening layer, region, or component is present.

An aspect of embodiments of the disclosure provides an ink composition including:

a scatterer; and a monomer, wherein the scatterer may include a first scatterer (e.g., a first light scatterer) and a second scatterer (e.g., a second light scatterer), and the first scatterer may be hydrophilic, and the second scatterer may be hydrophobic.

Monochromatic light generated by a light-emitting device passes through a quantum dot layer and/or a scattering layer to be emitted in a suitable or desired color. Here, when a bank absorbs monochromatic light generated by a light-emitting device and/or light emitted by quantum dots, efficiency of a display apparatus may be lowered or reduced. To solve this problem, there has been a technique of preventing or reducing absorption of light by the bank by coating a surface of the bank with a scatterer (e.g., a light scatterer). However, in this case, a quantum dot layer is formed after an additional process of the coating of the bank.

When the ink composition according to an embodiment is used, in a single process, the bank surface may be coated with a scatterer (e.g., a light scatterer), and at the same (or substantially the same) time, a quantum dot layer and/or a scattering layer (e.g., a light scattering layer) may be formed.

The ink composition according to an embodiment may further include, in addition to the first scatterer and the second scatterer, other scatterers (e.g., other light scatterers).

The terms "hydrophilic" and "hydrophobic" may be relative concepts, and will be described in more detail herein below.

In an embodiment, the first scatterer and the second scatterer may each independently be a scatterer (e.g., a light scatterer) in which a ligand-type compound (e.g., a ligand-containing compound) or a dispersant-type compound (e.g., a dispersant-containing compound) is coated on a scattering particle.

The ligand-type compound refers to a compound acting as a ligand that binds (e.g., bonds) to a metal. For example, the ligand-type compound is a compound that acts as a ligand to a metal by forming a chemical bond (e.g., a covalent or a coordinate covalent bond) between the ligand-type compound and the metal.

The dispersant-type compound refers to a compound that disperses a solid phase into a liquid phase, and for example, may be a compound in which a functional group bearing a charge is substituted in a polyacrylate-based polymer chain, a polyurethane-based polymer chain, and/or a polyethylene-based polymer chain. For example, the dispersant-type compound may be a compound that is soluble in a liquid phase.

In an embodiment, the scattering particle may include a metallic compound. For example, the scattering particle may include $Al_2O_3$, $SiO_2$, ZnO, $ZrO_2$, $BaTiO_3$, $TiO_2$, $Ta_2O_5$, $Ti_3O_5$, ZnO—Al, $Nb_2O_3$, SnO, MgO, $MgF_2$, or any combination thereof.

In an embodiment, the first scatterer may be a scatterer (e.g., a light scatterer) in which a first ligand-type compound (e.g., a first ligand-containing compound) or a first dispersant-type compound (e.g., a first dispersant-containing compound) is coated on the scattering particle.

The first ligand-type compound may:

include an amine group, but not a carboxyl group;

include not an amine group, but a carboxyl group; or include both an amine group and a carboxyl group, wherein a difference between an amine value and an acid value is 5 mg KOH/g or more.

The first dispersant-type compound may be a polyacrylate-based polymer, a polyurethane-based polymer, and/or a polyethylene-based polymer.

The polymer chain may:

include an amine group, but not a carboxyl group;

include not an amine group, but a carboxyl group; or include both an amine group and a carboxyl group, wherein a difference between an amine value and an acid value is 5 mg KOH/g or more.

The amine value is a value converted into mg of KOH after neutralization titration of the amine group included in 1 g of a compound with HCl, and the acid value is an mg value of KOH required for neutralization titration of the carboxyl group included in 1 g of a compound with KOH.

The first ligand-type compound may be hydrophilic, and for example, may include not the carboxyl group, but the amine group only, or may include not the amine group, but the carboxyl group only. In one or more embodiments, the first ligand-type compound may be hydrophilic, and for example, may include both the amine group and the carboxyl group, but the difference between the amine value and the acid value may be 5 mg KOH/g or more.

In another aspect of one or more embodiments, the first ligand-type compound and the first dispersant-type compound may each be hydrophilic, and, for example, when both the amine group and the carboxyl group are included, the difference between the number of the amine group and the number of the carboxyl group may be large enough to become hydrophilic.

In an embodiment, the second scatterer may be a scatterer (e.g., a light scatterer) in which a second ligand-type compound (e.g., a second ligand-containing compound) or a second dispersant-type compound (e.g., a second dispersant-containing compound) is coated on the scattering particle.

The second ligand-type compound may:

not include an amine group and a carboxyl group; or include both an amine group and a carboxyl group, wherein a difference between the amine value and the acid value is in a range of about 0 mg KOH/g to about 20 mg KOH/g.

The second dispersant-type compound may be a polyacrylate-based polymer, a polyurethane-based polymer, and/or a polyethylene-based polymer.

The polymer chain may:

not include an amine group and a carboxyl group; or include both an amine group and a carboxyl group, wherein a difference between the amine value and the acid value is in a range of about 0 mg KOH/g to about 20 mg KOH/g.

The amine value and the acid value are defined as described above.

The second ligand-type compound may be hydrophobic, and for example, may be a compound that does not include neither of the amine group and the carboxyl group. In one or more embodiments, the second ligand-type compound may be hydrophobic, and for example, may include both the amine group and the carboxyl group, but the difference between the amine value and the acid value may be in a range of about 0 mg KOH/g to about 20 mg KOH/g.

In another aspect of one or more embodiments, the second ligand-type compound and the second dispersant-type compound may each be hydrophobic, and, for example, when both the amine group and the carboxyl group are included, the difference between the number of the amine group and the number of the carboxyl group may be small enough to become hydrophobic.

The first scatterer and the second scatterer may each be a ligand-type or dispersant-type compound including both the amine group and the carboxyl group, wherein the difference between the amine value and the acid value may be greater than 5 mg KOH/g or less than 20 mg KOH/g.

For example, when the difference between the amine value and the acid value in one scatterer is 7 mg KOH/g, and the difference between the amine value and the acid value in another scatterer is 18 mg KOH/g, the scatterer having a relatively greater difference of 18 mg KOH/g between the amine value and the acid value is regarded as the first scatterer (hydrophilic), and the scatterer having a relatively smaller difference of 7 mg KOH/g between the amine value and the acid value is regarded as the second scatterer (hydrophobic). In one or more embodiments, the terms "hydrophilic" and "hydrophobic" may be relative concepts.

When the first scatterer and the second scatterer are each a compound including both the amine group and the carboxyl group, a compound having a large difference between the amine value and the acid value is more hydrophilic than a compound having a small difference between the amine value and the acid value. In one or more embodiments, when the first scatterer and the second scatterer are each a compound including both the amine group and the carboxyl group, a compound having a small difference between the amine value and the acid value is more hydrophobic than a compound having a large difference between the amine value and the acid value.

FIG. 1 is a diagram schematically illustrating interactions between; the first scatterer and the second scatterer according to an embodiment; and a bank in a quantum dot layer and/or a scattering layer after being ink-jetted.

Referring to FIG. 1, a bank surface that is in contact with a quantum dot layer is hydrophilic.

When the ink composition including the first scatterer and the second scatterer is applied between patterned banks (e.g., pixels), the first scatterer which is hydrophilic may move to the bank surface to coat the same. Here, the second scatterer which is hydrophobic maintains a dispersed state.

In FIG. 1, the bank surface that is in contact with a quantum dot layer may be hydrophilic, but, in one or more embodiments, may be hydrophobic. In a latter case, when the ink composition including the first scatterer and the second scatterer is applied between patterned banks, the second scatterer which is hydrophobic may move to the bank surface to coat the same. Here, the first scatterer which is hydrophilic maintains a dispersed state.

Next, following a curing process and/or a post-baking process, the bank surface that is in contact with a quantum dot layer accordingly generated may be in a coated stated as a scattering layer (e.g., a light scattering layer). Accordingly, the bank may not absorb monochromatic light generated by a light-emitting device and/or light emitted by quantum dots, and thus efficiency of a display apparatus may be increased.

However, in a case where the ink composition includes only one type (or kind) of scatterer (e.g., light scatterer), for example, in a case where the ink composition only includes a hydrophilic scatterer and an inner surface of the bank is hydrophilic, some of the hydrophilic scatterers included in the ink composition applied onto the quantum dot layer may move toward the bank and coat the bank surface. In this case, a concentration gradient of the scatterer is generated within pixels, and thus the central portion of the quantum dot layer deviates from the initial optimum or suitable concentration of the scatterer.

However, in a case where, for example, the ink composition only includes a hydrophobic scatterer and an inner surface of the bank is hydrophilic, the bank surface is not coated with the scatterer, and thus the bank may absorb light and the efficiency of a display apparatus may be reduced.

In one or more embodiments, in a case where the ink composition includes only one type (or kind) of scatterer (e.g., light scatterer), for example, in a case where the ink composition only includes a hydrophobic scatterer and an inner surface of the bank is hydrophobic, some of the hydrophobic scatterers included in the ink composition applied onto the quantum dot layer may move toward the bank and coat the bank surface. In this case, a concentration gradient of the scatterer is generated within pixels, and thus the central portion of the quantum dot layer deviates from the initial optimum or suitable concentration of the scatterer.

However, in a case where, for example, the ink composition only includes a hydrophilic scatterer and an inner surface of the bank is hydrophobic, the bank surface is not coated with the scatterer, and thus the bank may absorb light and the efficiency of a display apparatus may be reduced.

However, in a case where the ink composition only includes a hydrophobic scatterer and an inner surface of the bank is hydrophobic, or in a case where the ink composition only includes a hydrophilic scatterer and an inner surface of the bank is hydrophilic, adjustment or optimization of the scatterer concentration may be required or desired whenever architectures of pixels, e.g., size, shape, height, etc., are changed.

In one or more embodiments, when the ink composition according to an embodiment is used, one selected from the first scatterer and the second scatterer coats the bank, whereas the other maintains the initial optimum or suitable concentration of scatterers in the quantum dot layer (for example, in the central portion of the quantum dot layer), and thus, when the architectures of pixels are changed, the concentration of scatterers coated on the bank needs to be changed accordingly.

In addition, the bank coating and the optimum or suitable concentration of scatterers can be adjusted or optimized by adjusting the size and shape of the scatterer for each characteristic, and for adjusting or optimizing the scattering of visible light in a set or specific wavelength band for each RGB pixel, the size and shape of the bank-coating scatterers (e.g., light scatterers) may be adjusted.

In an embodiment, a particle diameter of the scatterer may vary depending on a role. For example, a scatterer (e.g., a light scatterer) coated on the bank (e.g., the first scatterer) among the scatterers may have a greater particle diameter than other scatterers (e.g., other light scatterers such as, for example, the second scatterer). For example, the scatterer coated on the bank (e.g., the first scatterer) among the scatterers may have a particle diameter in a range of 50 nm to 350 nm (based on D50), and the other scatterer (e.g., the second scatterer) may have a particle diameter in a range of 150 nm to 200 nm (based on D50). Accordingly, a large-sized scatterer having strong side scattering properties may be used for the bank coating. In one or more embodiments, a relatively small-sized scatterer (e.g., light scatterer) having a uniform (e.g., substantially uniform) distribution may result in uniform (e.g., substantially uniform) scattering (e.g., light scattering) within the quantum dot layer and/or the scattering layer.

However, the ink composition according to an embodiment does not have (or substantially does not have) large efficiency variation even when stored for a long period of time.

In an embodiment, the scatterer coated on the bank (e.g., the first scatterer) among the scatterers may have a polygonal or plate-like shape, and the other scatterer (e.g., the second scatterer) may have a spherical shape. When the scatterer coated on the bank (e.g., the first scatterer) has a polygonal or plate-like shape, an area to be coated may be minimized or reduced and have directionality, and thus light externally extracted may increase. For uniform (e.g., substantially uniform) scattering (e.g., light scattering) in the quantum dot layer and/or the scattering layer, the other scatterer (e.g., the second scatterer), other than the scatterer coated on the bank, (e.g., the first scatterer) may have a spherical shape.

In an embodiment, the total amount (e.g., total weight) of the scatterers may be in a range of about 1 wt % to about 70 wt % based on 100 wt % of the total amount (e.g., total weight) of the ink composition. For example, the total amount (e.g., total weight) of the scatterers may be in a range of about 1 wt % to about 60 wt %. For example, the total amount (e.g., total weight) of the scatterers may be in a range of about 1 wt to about 30 wt %. When the total amount (e.g., total weight) of the scatterers is within the ranges above, the efficiency of a display apparatus may be excellent.

In an embodiment, based on 100 wt % of the total amount (e.g., total weight) of the ink composition, the amount (e.g., weight) of the first scatterer may be in a range of about 0.1 wt % to about 5 wt %, and the amount (e.g., weight) of the second scatterer may be in a range of about 7 wt % to about 60 wt %. For example, the amount (e.g., weight) of the first scatterer may be in a range of about 0.1 wt % to about 2 wt %, and the amount (e.g., weight) of the second scatterer may be in a range of about 5 wt % to about 15 wt % (based on 100 wt % of the total amount (e.g., total weight) of the ink composition). In this case, the internal surface of the bank to which the ink composition is ink-jetted may be hydrophilic. Here, when the amounts (e.g., weights) of the first scatterer and the second scatterer are within the ranges above, the hydrophilic bank surface may be suitably or appropriately coated with the first scatterer, and the initial optimum or suitable concentration of the scatterers in the central portion of the quantum dot layer (or the scattering layer) may be maintained by the second scatterer.

In an embodiment, based on 100 wt % of the total amount (e.g., total weight) of the ink composition, the amount (e.g., weight) of the second scatterer may be in a range of about 0.1 wt % to about 5 wt %, and the amount (e.g., weight) of the first scatterer may be in a range of about 7 wt % to about 60 wt %. For example, the amount (e.g., weight) of the second scatterer may be in a range of about 0.1 wt % to about 2 wt %, and the amount (e.g., weight) of the first scatterer may be in a range of about 5 wt % to about 15 wt % (based on 100 wt % of the total amount (e.g., total weight) of the ink composition). In this case, the internal surface of the bank to which the ink composition is ink-jetted may be hydrophobic. Here, when the amounts (e.g., weights) of the first scatterer and the second scatterer are within the ranges above, the hydrophobic bank surface may be suitably or appropriately coated with the second scatterer, and the initial optimum or suitable concentration of the scatterers in the central portion of the quantum dot layer (or the scattering layer) may be maintained by the first scatterer.

In an embodiment, the ink composition according to an embodiment may further include quantum dots.

The term "quantum dot" as used herein refers to a crystal of a semiconductor compound, and may include any suitable material capable of emitting light of various suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, and/or any suitable process similar thereto.

The wet chemical process is a method including mixing a precursor material together with an organic solvent and then growing particle crystals of the quantum dot. When the crystals grow, the organic solvent naturally acts as a dispersant coordinated on the surface of the quantum dot crystals and controls the growth of the crystals so that the growth of quantum dot particles can be controlled through a process which costs lower, and is easier than vapor deposition methods, such as metal organic chemical vapor deposition (MOCVD) or molecular beam epitaxy (MBE).

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound are: a binary compound, such as CdS, CdSe, CdTe, ZnS, ZnSe, ZnTe, ZnO, HgS, HgSe, HgTe, MgSe, MgS, etc.; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, etc.; a quaternary compound, such as CdZnSeS, CdZnSeTe, CdZnSTe, CdHgSeS, CdHgSeTe, CdHgSTe, HgZnSeS, HgZnSeTe, HgZnSTe, etc.; or any combination thereof.

Examples of the Group III-V semiconductor compound are: a binary compound, such as GaN, GaP, GaAs, GaSb, AlN, AlP, AlAs, AlSb, InN, InP, InAs, InSb, etc.; a ternary compound, such as GaNP, GaNAs, GaNSb, GaPAs, GaPSb, AlNP, AlNAs, AlNSb, AlPAS, AlPSb, InGaP, InNP, InAlP, InNAs, InNSb, InPAs, InPSb, etc.; a quaternary compound, such as GaAlNP, GaAlNAs, GaAlNSb, GaAlPAS, GaAlPSb, GaInNP, GaInNAs, GaInNSb, GaInPAs, GaInPSb, InAlNP, InAlNAs, InAlNSb, InAlPAs, InAlPSb, etc.; or any combination thereof. In an embodiment, the Group III-V semiconductor compound may further include a Group II element. Examples of the Group III-V semiconductor compound further including the Group II element are InZnP, InGaZnP, InAlZnP, etc.

Examples of the Group III-VI semiconductor compound are: a binary compound, such as GaS, GaSe, $Ga_2Se_3$, GaTe, InS, InSe, $In_2S_3$, $In_2Se_3$, InTe, etc.; a ternary compound, such as $InGaS_3$, $InGaSe_3$, etc.; or any combination thereof.

Examples of the Group I-III-VI semiconductor compound are: a ternary compound, such as AgInS, $AgInS_2$, CuInS, $CuInS_2$, $CuGaO_2$, $AgGaO_2$, $AgAlO_2$, AgInGaS, etc.; or any combination thereof.

Examples of the Group IV-VI semiconductor compound are: a binary compound, such as SnS, SnSe, SnTe, PbS, PbSe, PbTe, etc.; a ternary compound, such as SnSeS, SnSeTe, SnSTe, PbSeS, PbSeTe, PbSTe, SnPbS, SnPbSe, SnPbTe, etc.; a quaternary compound, such as SnPbSSe, SnPbSeTe, SnPbSTe, etc.; or any combination thereof.

Examples of the Group IV element or compound are: a single element compound, such as Si, Ge, etc.; a binary compound, such as SiC, SiGe, etc.; or any combination thereof.

Each element included in a multi-element compound, such as the binary compound, the ternary compound, and the quaternary compound, may be present at a uniform concentration or non-uniform concentration in a particle.

In an embodiment, the quantum dot may have a single structure in which the concentration of each element in the quantum dot is uniform (e.g., substantially uniform), or may have a core-shell dual structure. For example, a material included in the core and a material included in the shell may be different from each other.

The shell of the quantum dot may act as a protective layer that prevents or reduces chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases along a direction toward the center of the core.

Examples of the shell of the quantum dot are an oxide of metal, metalloid, and/or non-metal, a semiconductor compound, or a combination thereof. Examples of the oxide of metal, metalloid, and/or non-metal are: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, etc.; a ternary compound, such as $MgAl_2O_4$, $CoFe_2O_4$, $NiFe_2O_4$, $CoMn_2O_4$, etc.; or any combination thereof. Examples of the semiconductor compound are: as described herein, a Group II-VI semiconductor compound; a Group III-V semiconductor compound; a Group III-VI semiconductor compound; a Group I-III-VI semiconductor compound; a Group IV-VI semiconductor compound; or any combination thereof. Examples of the semiconductor compound are CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have an FWHM of the emission wavelength spectrum of less than or equal to about 45 nm, less than or equal to about 40 nm, or for example, less than or equal to about 30 nm. When the FWHM of the quantum dot is within these ranges, the quantum dot may have improved color purity and/or improved color reproducibility. In addition, because light emitted through the quantum dot is emitted in all (e.g., substantially all) directions, the wide viewing angle may be improved.

In addition, the quantum dot may be in the form of spherical, pyramidal, multi-arm, and/or cubic nanoparticles, nanotubes, nanowires, nanofibers, and/or nanoplate particles.

Because the energy band gap may be adjusted by controlling a size of the quantum dot, light having various suitable wavelength bands may be obtained from the quantum dot emission layer. Accordingly, by using quantum dots 100 of different sizes, a light-emitting device that emits light of various suitable wavelengths may be implemented. In an embodiment, the size of the quantum dots 100 may be selected to emit red light, green light, and/or blue light. In addition, the size of the quantum dots 100 may be configured to emit white light by combination of light of various suitable colors.

In an embodiment, an amount (e.g., weight) of the quantum dot may be in a range of about 1 wt % to about 60 wt % (based on 100 wt % of the total amount (e.g., total weight) of the ink composition). In the ink composition, materials other than the quantum dots and the scatterers may be monomers (e.g., monomers including or consisting of terminals (or acrylates), such as, for example, acrylate, diacrylate, and/or methacrylate) and, optionally, other additives.

In an embodiment, the amount (e.g., weight) of the quantum dot may be in a range of about 20 wt % to about 40 wt % (based on 100 wt % of the total amount (e.g., total weight) of the ink composition). The other additives may include an initiator, a viscosity modifier, etc.

For example, the amount (e.g., weight) of the quantum dot may be in a range of about 10 wt % to about 50 wt %, the amount (e.g., weight) of the first scatterer may be in a range of about 0.1 wt % to about 5 wt %, and the amount (e.g., weight) of the second scatterer may be in a range of about 7 wt % to about 15 wt % (based on 100 wt % of the total amount (e.g., total weight) of the ink composition). For example, the amount (e.g., weight) of the quantum dot may be in a range of about 10 wt % to about 50 wt %, the amount (e.g., weight) of the second scatterer may be in a range of about 0.1 wt % to about 5 wt %, and the amount (e.g., weight) of the first scatterer may be in a range of about 7 wt % to about 15 wt % (based on 100 wt % of the total amount (e.g., total weight) of the ink composition).

A layer according to another aspect of embodiments of the disclosure is prepared by the ink composition.

The ink composition ink-jetted to the bank (e.g., pixel) pattern on the quantum dot layer and/or the scattering layer may form a quantum dot layer and/or a scattering layer through a curing process and/or a post-baking process.

A display apparatus according to another aspect of embodiments may include:

a first substrate on which a light-emitting device is provided; and a light controller on the first substrate and corresponding to the light-emitting device, wherein the light controller may include: a quantum dot layer and/or a scattering layer; a color filter layer; and a bank, and the quantum dot layer and/or the scattering layer may be a layer prepared by the ink composition.

In an embodiment, the quantum dot layer and/or the scattering layer may be in contact with the bank, a surface of the bank in contact with the quantum dot layer and/or the scattering layer may be hydrophilic, and in the quantum dot layer and/or the scattering layer, an amount (e.g., weight) of the first scatterer may be in a range of about 0.1 percent by weight (wt %) to about 5 wt %, and an amount (e.g., weight) of the second scatterer may be in a range of about 7 wt % to about 60 wt % (based on 100 wt % of the total amount (e.g., total weight) of the ink composition).

In an embodiment, the quantum dot layer and/or the scattering layer may be in contact with the bank, a surface of the bank in contact with the quantum dot layer and/or the scattering layer may be hydrophobic, and in the quantum dot layer and/or the scattering layer, the amount (e.g., weight) of the second scatterer may be in a range of about 0.1 wt % to about 5 wt %, and the amount (e.g., weight) of the first scatterer may be in a range of about 7 wt % to about 15 wt % (based on 100 wt % of the total amount (e.g., total weight) of the ink composition).

In an embodiment, the light-emitting device may include:

a first electrode; a second electrode facing the first electrode; and an interlayer between the first electrode and the second electrode and including an emission layer.

In an embodiment, the interlayer may further include: a hole transport region including a hole injection layer, a hole transport layer, an emission auxiliary layer, an electron blocking layer, or any combination thereof; and/or an electron transport region including a hole blocking layer, an electron transport layer, an electron injection layer, or any combination thereof.

In an embodiment, the display apparatus may further include an inorganic capping layer.

Hereinafter, embodiments of the present disclosure will be described with reference to FIGS. 2-4.

Figure 2:
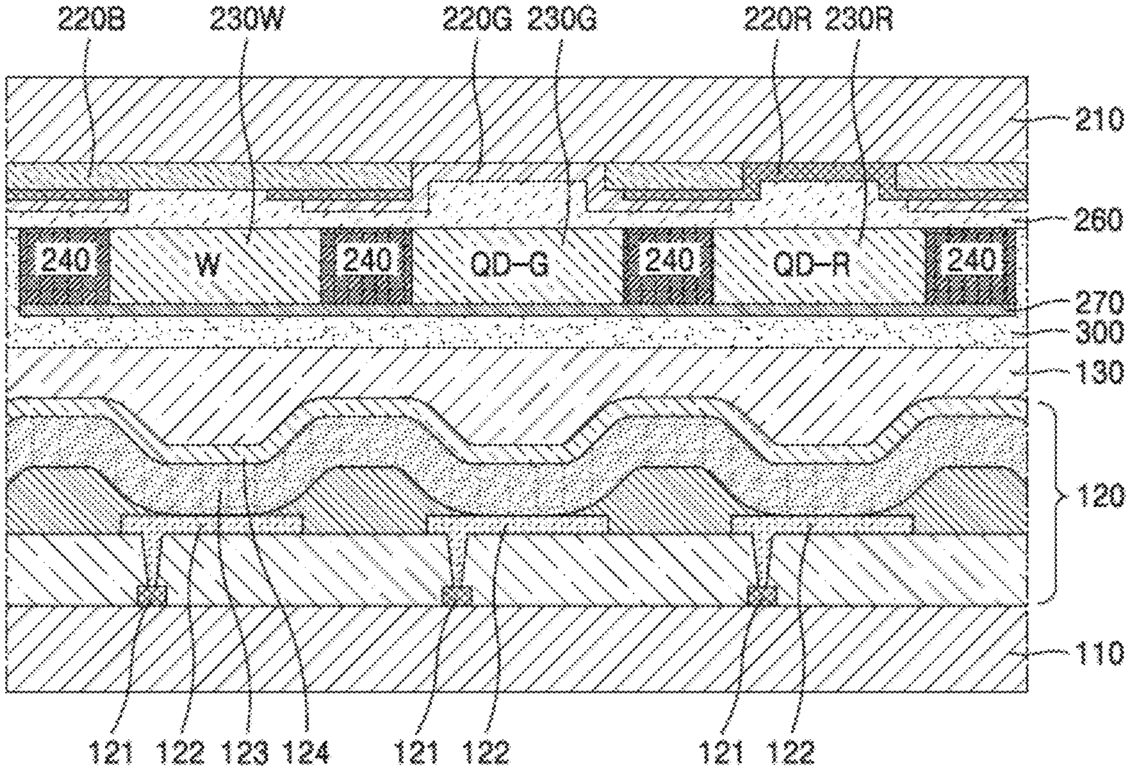
FIG. 2 is a cross-sectional view of a display apparatus according to an embodiment.

FIG. 2 is a cross-sectional view of the display apparatus according to an embodiment. In FIG. 2, a plurality of light-emitting devices and a plurality of light controllers are provided in plural. In addition, only one set of three color pixels of red, green, and blue is shown in FIG. 2, however, in actual products, a plurality of sets of such three color pixels may be distributed or distributed.

As shown in FIG. 2, the display apparatus according to an embodiment may have a structure in which a first substrate 110 on which a light-emitting device 120 is provided is bonded with a second substrate 210 on which light controllers, such as quantum dot layers 230R and 230G, a scattering layer 230W, and color filter layers 220R, 220G, and 220B, are provided, together with a filling material 300 therebetween (e.g., between the first substrate 110 and the second substrate 210). Here, an inorganic capping layer 270 may be between the light-emitting device 120 and the quantum dot layer 230R and 230G.

The light-emitting device 120 may have a structure in which an interlayer 123 including an emission layer is between a first electrode 122 and a second electrode 124, and holes and electrons respectively injected from the two electrodes 122 and 124 may recombine in the emission layer in the interlayer 123, thus generating light. For example, red, green, and blue pixels may absorb, transmit, and/or generate light having a wavelength in a range of about 380 nm to about 780 nm. In one or more embodiments, the light-emitting device 120 may generate light having a wavelength in a range of about 380 nm to about 500 nm, light having a wavelength of about 380 nm to about 650 nm, or light having a wavelength of about 380 nm to about 780 nm. The light controller of each pixel may convert the light into red light, green light, and blue light. The light-emitting device 120 will be described in more detail herein below.

A reference numeral 121 indicates a pixel circuit connected to the first electrode 122, and the pixel circuit may include elements such as a thin-film transistor and a capacitor. Also, a reference numeral 130 indicates a thin-film encapsulation layer that protects the light-emitting device 120 by covering the same. The thin-film encapsulation layer may be a single-layered film of an organic film or an inorganic film, or may be a multi-layered film in which an organic film and an inorganic film are alternately stacked. The inorganic film may include silicon oxide, silicon nitride, and/or silicon oxynitride, and the organic film may include polyethylene terephthalate, polyethylene naphthalate, polycarbonate, polyimide, polyethylene sulfonate, polyoxymethylene, polyarylate, hexamethyldisiloxane, acryl-based resin (for example, polymethylmethacrylate and/or polyacrylic acid), or any combination thereof.

The light controllers may include a quantum dot layer, a color filter layer, a scattering layer, a bank, or any combination thereof. Here, the quantum dot layer and/or the scattering layer may be a layer formed by the ink composition according to an embodiment.

The quantum dot layers 230R and 230G, the scattering layer 230W, and the color filter layers 220R, 220G, and 220B may be prepared as the light controllers. The quantum dot layers 230R and 230G may convert blue light generated from the light-emitting device 120 into red light or green light. The color filter layers 220R, 220G, and 220B may improve color purity by filtering out stray light that may be partially mixed in the converted color. Here, all the quantum dot layers 230R and 230G and the color filter layers 220R and 220G may be provided in the red pixel and the green pixel, whereas only the scattering layer 230W and the blue color filter layer 220B may be provided in the blue pixel. The reason is that the light generated by the light-emitting device 120 is, for example, blue light. In one or more embodiments, light conversion is not required in the blue pixel, and blue light may pass through the scattering layer 230W only. Thus, only the blue color filter layer 220B for filtering the stray light is provided. The scattering layer 230W may not include quantum dots, and may be formed by the ink composition according to an embodiment.

A reference numeral 260 indicates a low refractive index layer 260 having a refractive index of about 1.2 (e.g., at a wavelength of 589 nm). The side-scattered light, which has passed through the quantum dot layers 230R and 230G and the scattering layer 230W, may totally be reflected at the interface of the low refractive index layer 260 due to the refractive index difference between the low refractive index layer 260 and the quantum dot layers 230R and 230G and the scattering layer 230W, so that the light may be re-scattered inside the quantum dot layers 230R and 230G and the scattering layer 230W. The low refractive index layer 260 is to increase luminance by converting side scattering into front scattering.

The quantum dot layers 230R and 230G may be formed by a solution process, such as an inkjet process, using the ink composition according to an embodiment further including quantum dots. The ink composition may include quantum dots, scatterers (e.g., light scatterers), monomers, initiators, and additives. The scatterers may include a first scatterer and a second scatterer, wherein the first scatterer may be hydrophilic, and the second scatterer may be hydrophobic.

The additives may include, for example, a dispersant, a viscosity modifier, or any combination thereof. The ink composition may not include a solvent. The dispersant may include, for example, a polyacryl-based dispersant, a polyurethane-based dispersant, a polyethylene-based dispersant, an epoxy-based dispersant, an ester-based dispersant, and/or the like. The initiator may be any suitable initiator generally used in the art to cure a polymer.

The initiator may include, for example, TPO, Quantacure BMS, an oxime-base compound as follows, and/or ethyl phenyl(2,4,6-trimethylbenzoyl)phosphinate):

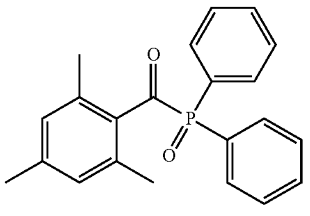

TPO

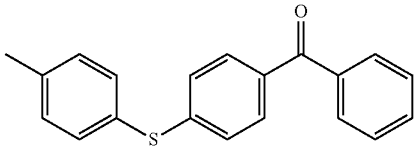

Quantacure BMS

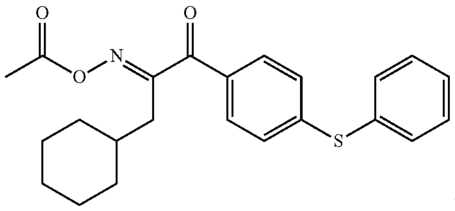

Oxime-type

The initiator may be included in an amount (e.g., weight) of about 0.1 wt % to about 50 wt % based on 100 wt % of the monomer.

The additive may be included in an amount (e.g., weight) of about 0.1 wt % to about 50 wt % based on 100 wt % of the monomer.

The scattering layer 230W may be formed by a solution process, such as an inkjet process, using the ink composition according to an embodiment. For example, the ink composition may be the one excluding only quantum dots from the ink composition forming the quantum dot layers 230R and 230G.

A reference numeral 240 in FIG. 2 indicates a bank forming a boundary between light controllers of each pixel.

A portion formed by overlapping the color filter layers 220R, 220G, and 220B between the bank 240 and the second substrate 210 may function as a black matrix.

One surface of the bank 240 facing the first substrate 110 may have a hydrophobic property. The other surface of the bank in contact with the quantum dot layers 230R and 230G and/or the scattering layer 230W may be hydrophilic or hydrophobic. Light (for example, monochromatic light) generated from a light source (e.g., an organic light-emitting device) may pass through the quantum dot layers 230R and 230G and the color filter 220R, 220G, and 220B and may be then converted into one color of red, green, and blue and emitted.

In one or more embodiments, in forming the bank 240, a bank composition may be applied on a substrate and cured, and then may undergo a photolithography process. The bank composition may include a curable polymer, a photoresist compound, a fluorine-containing polymer, a black pigment, a scattering agent (e.g., a light scattering agent), and/or the like, and a solvent. When the bank composition is cured, the solvent evaporates completely.

The filling material 300 may be between the first substrate 110 and the second substrate 210, wherein the filling material 300 functions as both a gap maintainer that maintains a suitable or appropriate distance between the two substrates 110 and 210 and a bonding agent. Accordingly, when the filling material 300 is coated between the two substrates 110 and 210, which are then bonded together, the filling material 300 may serve to firmly bond the two substrates 110 and 210 while suitably or properly maintaining a gap therebetween.

The display apparatus having the aforementioned structure may be manufactured through processes shown in FIGS. 3A-3E.

Figure 3A:
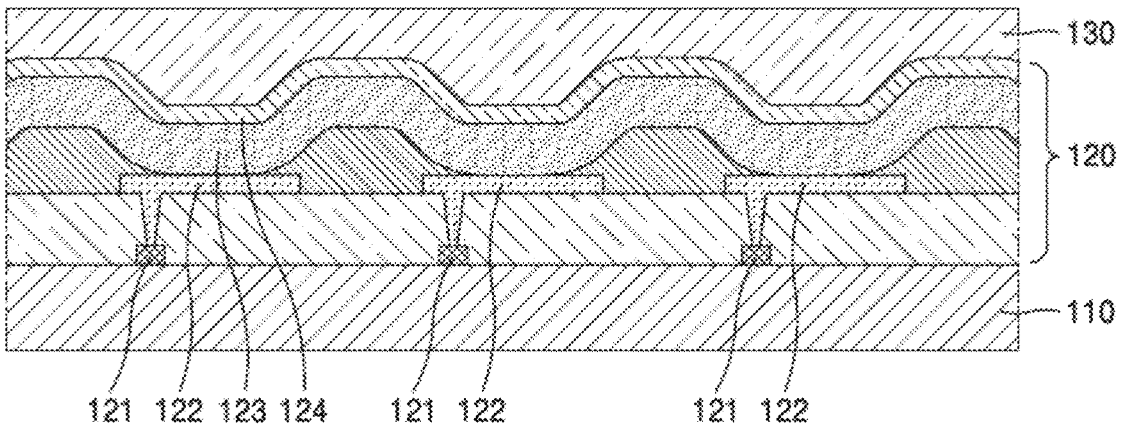
FIGS. 3A-3E are cross-sectional views sequentially illustrating a manufacturing process of the display apparatus of FIG. 2.
Figure 4:
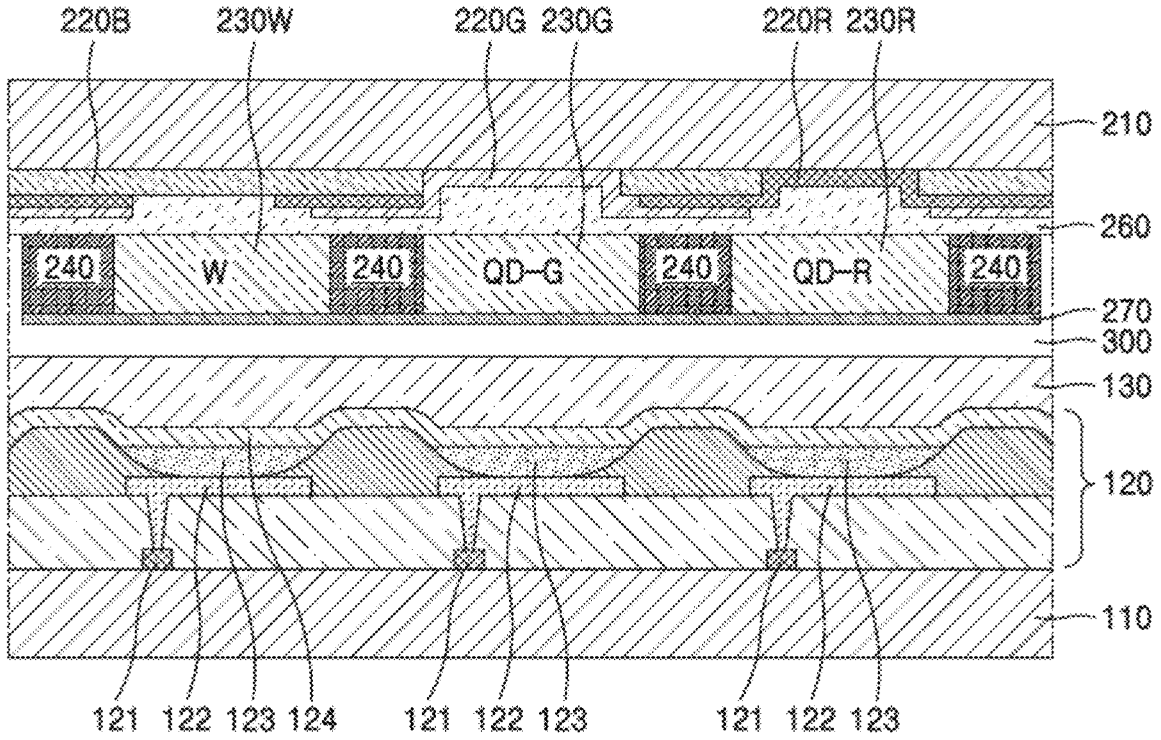
FIG. 4 is a cross-sectional view of a display apparatus according to another embodiment.

First, as shown in FIG. 3A, the light-emitting device 120 is formed on the first substrate 110, which is the covered by a thin-film encapsulation layer 130.

Figure 3B:
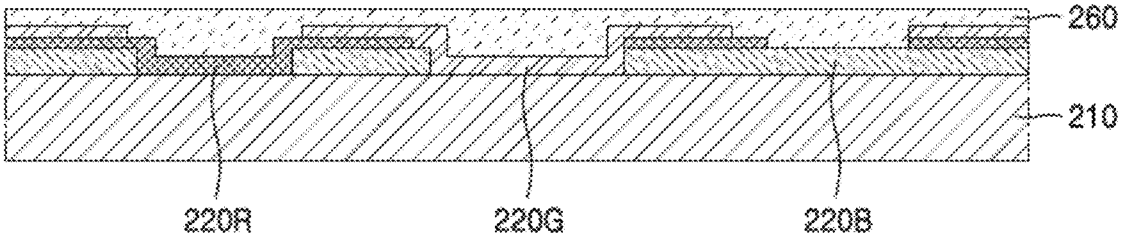

Next, as shown in FIG. 3B, the color filter layers 220R, 220G, and 220B are patterned on the second substrate 210. The color filter layers 220R, 220G, and 220B may be formed at a position corresponding to the light-emitting device 120, and a partial region, in which the color filter layer 220R, the color filter layer 220G, and the color filter layer 220B may overlap, may serve as a black matrix. For example, a hollow silica material may be prepared on the color filter layers 220R, 220G, and 220B to form a low refractive index layer 260 on the color filter layers 220R, 220G, and 220B. The low refractive index layer 260 may have a refractive index in a range of about 1.1 to about 1.5 (e.g., at a wavelength of 589 nm), and a thickness in a range of about 0.1 μm to about 5 μm.

Figure 3C:
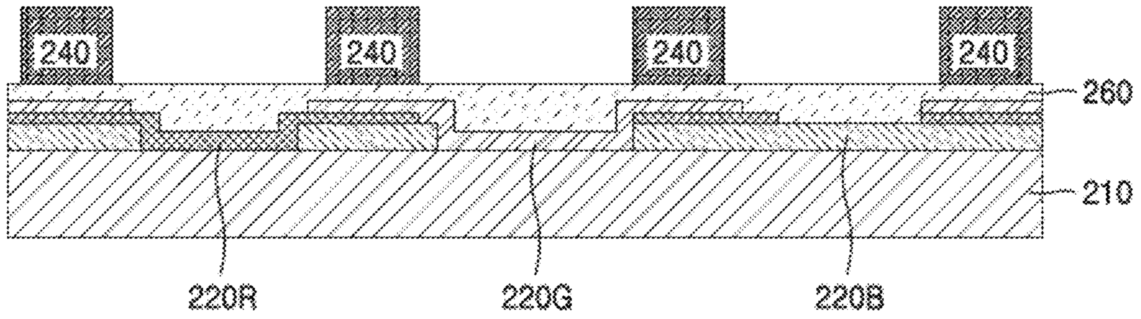

Next, as shown in FIG. 3C, on the low refractive index layer 260, the bank 240 is patterned on a region in which the color filter layers 220R, 220G, and 220B overlapped to remain at each position between the color filter layers 220R, 220G, and 220B.

Figure 3D:
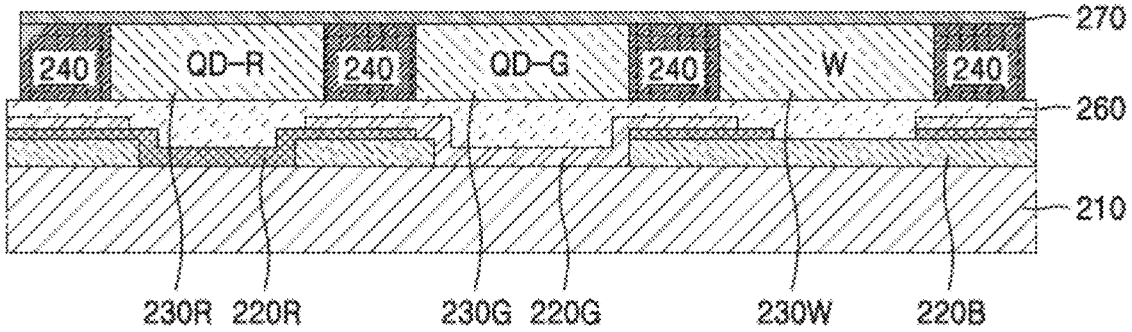

Afterwards, as shown in FIG. 3D, the quantum dot layers 230R and 230G are formed in the red and green pixels, whereas the scattering layer 230W is formed in the blue pixel. Here, the quantum dot layers 230R and 230G may be formed at a position overlapping with the color filter layers 220R and 220G. The scattering layer 230W may be formed at a position overlapping with the color filter layer 220B. The quantum dot layers 230R and 230G and the scattering layer 230W may be formed by an inkjet process.

In one or more embodiments, the quantum dots, which are photochromic particles, included in the quantum dot layers 230R and 230G are defined the same as described herein.

After forming the quantum dot layers 230R and 230G and/or the scattering layer 230W, a curing process (for example, UV irradiation at a wavelength of 390 nm for less than 1 minute) may be performed thereon to complete the formation of the quantum dot layers 230R and 230G and the scattering layer 230W.

Next, a post-baking process is performed thereon to form the inorganic capping layer 270 by a chemical vapor deposition method.

The inorganic capping layer 270 may be a layer including Si, N, any combination thereof, and/or an oxide of any combination thereof, and may have a thickness in a range of about 1,000 Å to about 10,000 Å.

Figure 3E:
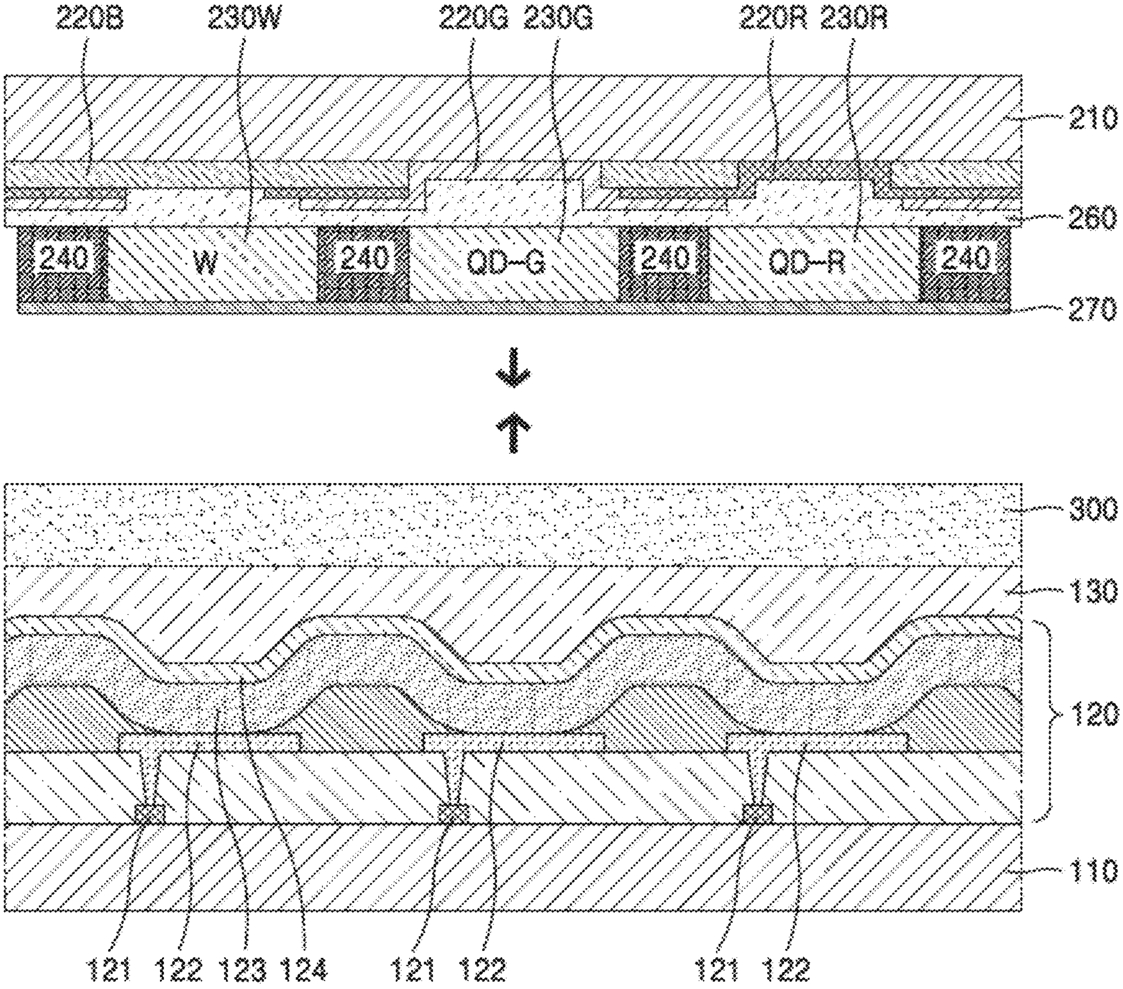

Subsequently, as shown in FIG. 3E, the filling material 300 is applied between the first and second substrates 110 and 210, and the two substrates 110 and 210 are bonded. Accordingly, the display apparatus in which the light-emitting device 120 and the quantum dot layers 230R and 230G, and the color filter layers 220R, 220G, and 220B are provided is implemented as shown in FIG. 2.

In this embodiment, a case where the interlayer 123 including the emission layer of the light-emitting device 120 is formed as a common layer over the entire pixel regions is described. However, as shown in FIG. 4, modifications are also available in a way that the interlayer 123 may be formed separately for each pixel. In one or more embodiments, the interlayer 123 including the emission layer may be formed as a common layer, or may be formed separately for each pixel.

The emission layer may include an organic light-emitting material and/or a light-emitting material (e.g., an inorganic light-emitting material).

The light-emitting device 120 will be described in more detail.

First Electrode 122

In FIG. 2, a substrate may be additionally arranged under the first electrode 122 and/or above the second electrode 124. For use as the substrate, a glass substrate and/or a plastic substrate may be used.

The first electrode 122 may be formed by, for example, depositing and/or sputtering a material for forming the first electrode 122 on the substrate. When the first electrode 122 is an anode, a material for forming the first electrode 122 may be a high work function material that facilitates injection of holes.

The first electrode 122 may be a reflective electrode, a semi-transmissive electrode, or a transmissive electrode. In an embodiment, when the first electrode 122 is a transmissive electrode, a material for forming the first electrode 122 may include indium tin oxide (ITO), indium zinc oxide (IZO), tin oxide ($SnO_2$), zinc oxide (ZnO), or any combinations thereof. In one or more embodiments, when the first electrode 122 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode.

The first electrode 122 may have a single-layered structure consisting of a single layer or a multi-layered structure including a plurality of layers. In an embodiment, the first electrode 122 may have a three-layered structure of ITO/Ag/ITO.

Interlayer 123

The interlayer 123 may be located on the first electrode 122. The interlayer 123 may include an emission layer.

The interlayer 123 may further include a hole transport region located between the first electrode 122 and the emission layer and an electron transport region located between the emission layer and the second electrode 124.

The interlayer 123 may further include, in addition to various suitable organic materials, metal-containing compounds such as organometallic compounds, inorganic materials such as quantum dots, and/or the like.

In one or more embodiments, the interlayer 130 may include, i) two or more emitting units sequentially stacked between the first electrode 110 and the second electrode 150, and ii) a charge generation layer located between the two emitting units. When the interlayer 123 includes the emitting unit and the charge generation layer as described above, the light-emitting device 120 may be a tandem light-emitting device.

Hole Transport Region in Interlayer 123

The hole transport region may have: i) a single-layer structure consisting of a single layer consisting of a single material, ii) a single-layer structure consisting of a single layer consisting of a plurality of materials that are different from each other, or iii) a multi-layer structure including a plurality of materials including a plurality of materials that are different from each other.

The hole transport region may include a hole injection layer, a hole transport layer, an emission auxiliary layer, an electron blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 122.

The hole transport region may include a compound represented by Formula 201, a compound represented by Formula 202, or any combination thereof:

Formula 201

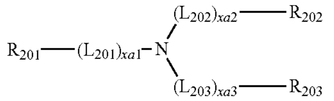

Formula 202

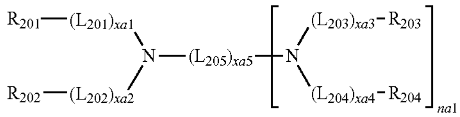

In Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic unsubstituted or substituted with at least one $R_{10a}$ (for example, a carbazole group), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one selected from groups represented by Formulae CY201 to CY217:

CY201

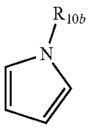

CY202

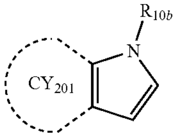

CY203

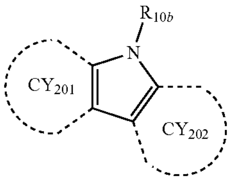

CY204

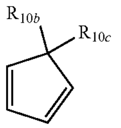

CY205

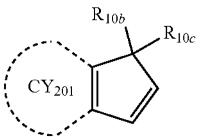

CY206

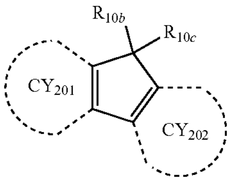

-continued

CY207

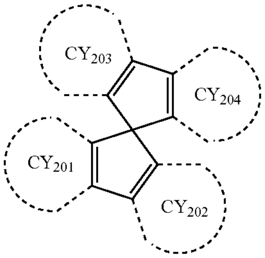

CY208

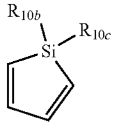

CY209

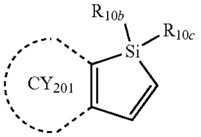

CY210

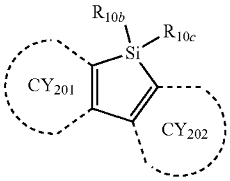

CY211

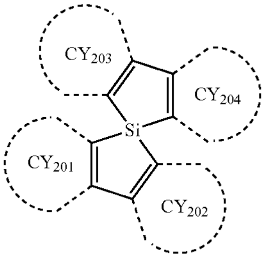

CY212

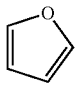

CY213

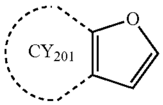

CY214

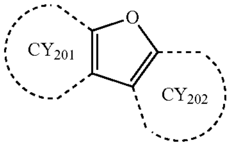

CY215

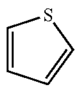

CY216

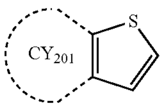

-continued

CY217

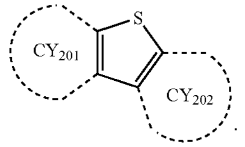

$R_{10b}$ and $R_{10c}$ in Formulae CY201 to CY217 may each be as defined in $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted from the emission layer, and the electron-blocking layer may block or reduce the leakage of electrons from the emission layer to the hole transport region. Materials that may be included in the hole transport region may be included in the emission auxiliary layer and the electron blocking layer.

p-Dopant

The hole transport region may further include, in addition to these materials, a charge-generation material for the improvement of conductive properties (e.g., electrically conductive properties). The charge-generation material may be uniformly or non-uniformly dispersed in the hole transport region (for example, in the form of a single layer consisting of a charge-generation material).

The charge-generation material may be, for example, a p-dopant.

For example, the p-dopant may have a LUMO energy level of less than or equal to about −3.5 eV.

In an embodiment, the p-dopant may include a quinone derivative, a cyano group-containing compound, a compound including element EL1 and element EL2, or any combination thereof.

Examples of the quinone derivative are TCNQ, F4-TCNQ, and the like.

Examples of the cyano group-containing compound are HAT-CN, a compound represented by Formula 221, and the like.

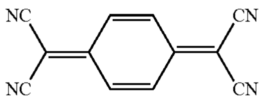

TCNQ

-continued

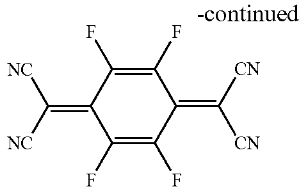

F4-TCNQ

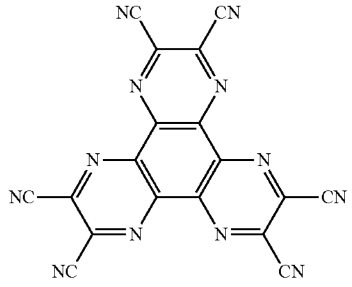

HAT-CN

Formula 221

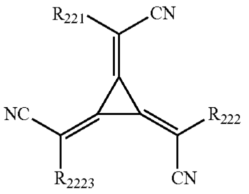

In Formula 221, $R_{221}$ to $R_{223}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and at least one selected from $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Emission Layer in Interlayer 123

When the light-emitting device 120 is a full-color light-emitting device, the emission layer may be patterned into a red emission layer, a green emission layer, and/or a blue emission layer, according to a sub-pixel. In an embodiment, the emission layer may have a stacked structure of two or more layers of a red emission layer, a green emission layer, and a blue emission layer, in which the two or more layers contact each other or are separated from each other, to emit white light. In one or more embodiments, the emission layer may include two or more materials of a red light-emitting material, a green light-emitting material, and a blue light-emitting material, in which the two or more materials are mixed together with each other in a single layer, to emit white light.

In an embodiment, the emission layer may include a host and a dopant. The dopant may include a phosphorescent dopant, a fluorescent dopant, or any combination thereof.

The amount (e.g., weight) of the dopant in the emission layer may be in a range of about 0.01 part by weight to about 15 parts by weight based on 100 parts by weight of the host.

In one or more embodiments, the emission layer may include a quantum dot. The quantum dot is the same as described above.

In one or more embodiments, the emission layer may include a delayed fluorescence material. The delayed fluorescence material may act as a host or a dopant in the emission layer 120.

$Q_{301}$ to $Q_{303}$ may each be the same as described in connection with $Q_1$.

For example, when xb11 in Formula 301 is 2 or more, two or more of $Ar_{301}$ may be linked to each other via a single bond.

In one or more embodiments, the host may include a compound represented by Formula 301-1, a compound represented by Formula 301-2, or any combination thereof:

Formula 301-1

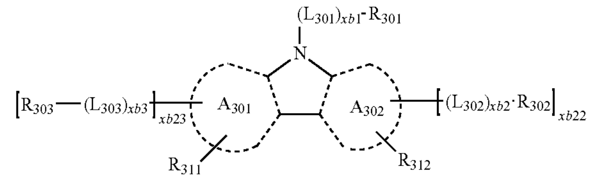

Formula 301-2

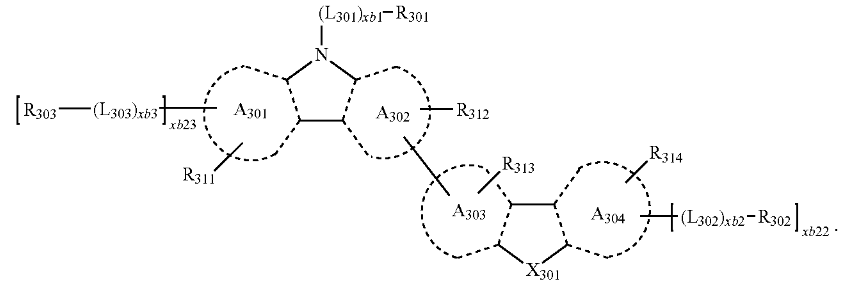

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

The thickness of the emission layer may be in a range of about 100 Å to about 1,000 Å, for example, about 200 Å to about 600 Å. When the thickness of the emission layer 120 is within these ranges, excellent luminescence characteristics may be obtained without a substantial increase in driving voltage.

Host

In an embodiment, the host may include a compound represented by Formula 301:

$$[Ar_{301}]_{xb11}\text{-}[(L_{301})_{xb1}\text{-}R_{301}]_{xb21} \quad \text{Formula 301}$$

wherein, in Formula 301, $Ar_{301}$ and $L_{301}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and Phosphorescent Dopant The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

$$M(L_{401})_{xc1}(L_{402})_{xc2} \quad \text{Formula 401}$$

-continued

Formula 402

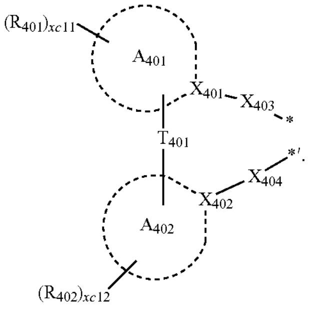

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 is 1, 2, or 3, wherein, when xc1 is 2 or more, two or more of $L_{401}$ may be identical to or different from each other, $L_{402}$ may be an organic ligand, and xc2 may be 0, 1, 2, 3, or 4, wherein, when xc2 is 2 or more, two or more of $L_{402}$ may be identical to or different from each other, $X_{401}$ and $X_{402}$ may each independently be N or C, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (for example, a covalent bond or a coordination bond, which may also be referred to as a coordinate covalent bond or a dative bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described in connection with $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen and $X_{402}$ may be carbon, or ii) each of $X_{401}$ and $X_{402}$ may be nitrogen.

In one or more embodiments, when xc1 in Formula 402 is 2 or more, two ring $A_{401}$(s) in two or more of $L_{401}$(s) may be optionally linked to each other via $T_{402}$, which is a linking group, or two ring $A_{402}$(s) may be optionally linked to each other via $T_{403}$, which is a linking group (see Compounds PD1 to PD4 and PD7). $T_{402}$ and $T_{403}$ may each independently be as defined in $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

Fluorescent Dopant

The fluorescent dopant may include an amine group-containing compound, a styryl group-containing compound, or any combination thereof.

For example, the fluorescent dopant may include a compound represented by Formula 501:

Formula 501

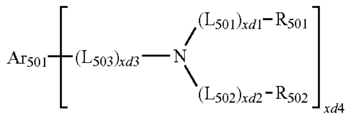

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, a pyrene group, etc.) in which three or more monocyclic groups are condensed together.

In an embodiment, xd4 in Formula 501 may be 2.

Delayed Fluorescence Material

The emission layer may include a delayed fluorescence material.

In the present specification, the delayed fluorescence material may be selected from compounds capable of emitting delayed fluorescence based on a delayed fluorescence emission mechanism.

The delayed fluorescence material included in the emission layer may act as a host or a dopant depending on the type (or kind) of other materials included in the emission layer.

In an embodiment, a difference between a triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 120 may be improved.

For example, the delayed fluorescence material may include: i) a material including at least one electron donor (for example, a π electron-rich $C_3$-$C_{60}$ cyclic group and the like, such as a carbazole group) and at least one electron acceptor (for example, a sulfoxide group, a cyano group, a π electron-deficient nitrogen-containing $C_1$-$C_{60}$ cyclic group, and/or the like), ii) a material including a $C_8$-$C_{60}$ polycyclic group including at least two cyclic groups condensed to each other while sharing boron (B), and/or the like.

Electron Transport Region in Interlayer 123

The electron transport region may have: i) a single-layer structure consisting of a single layer consisting of a single material, ii) a single-layer structure consisting of a single layer consisting of a plurality of different materials, or iii) a multi-layer structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein constituent layers of each structure are sequentially stacked from the emission layer.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

For example, the electron transport region may include a compound represented by Formula 601:

$$[Ar_{601}]_{xe11}\text{-}[(L_{601})_{xe1}\text{-}R_{601}]_{xe21}. \qquad \text{Formula 601}$$

In Formula 601,

- $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
- xe11 may be 1, 2, or 3,
- xe1 may be 0, 1, 2, 3, 4, or 5,
- $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$,
- $Q_{601}$ to $Q_{603}$ may each be the same as described in connection with $Q_1$,
- xe21 may be 1, 2, 3, 4, or 5, and
- at least one selected from $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$ may be linked to each other via a single bond.

In an embodiment, $Ar_{601}$ in Formula 601 may be a substituted or unsubstituted anthracene group.

In one or more embodiments, the electron transport region may include a compound represented by Formula 601-1:

Formula 601-1

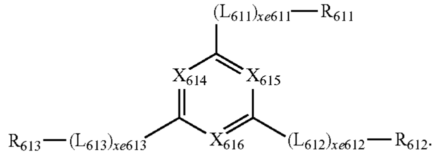

In Formula 601-1,

- $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N,
- $L_{611}$ to $L_{613}$ may each be the same as described in connection with $L_{601}$,
- xe611 to xe613 may each be the same as described in connection with xe1,
- $R_{611}$ to $R_{613}$ may each be the same as described in connection with $R_{601}$, and
- $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The thickness of the electron transport region may be in a range of about 100 Å to about 5,000 Å, for example, about 160 Å to about 4,000 Å. When the electron transport region includes a buffer layer, a hole blocking layer, an electron control layer, an electron transport layer, or any combination thereof, the thickness of the buffer layer, the hole blocking layer, or the electron control layer may be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thickness of the buffer layer, the hole-blocking layer, the electron control layer, the electron transport layer, and/or the electron transport layer are within these ranges, suitable or satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) and/or ET-D2:

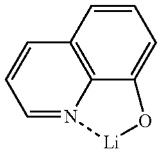

ET-D1

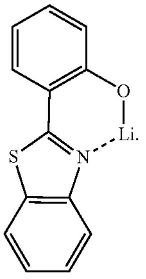

ET-D2

The electron transport region may include an electron injection layer that facilitates the injection of electrons from the second electrode 124. The electron injection layer may directly contact the second electrode 124.

The electron injection layer may have: i) a single-layer structure consisting of a single layer consisting of a single material, ii) a single-layer structure consisting of a single layer consisting of a plurality of different materials, or iii) a multi-layer structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and/or the rare earth metal-containing compound may be oxides, halides (for example, fluorides, chlorides, bromides, iodides, etc.), and/or tellurides of the alkali metal, the alkaline earth metal, and/or the rare earth metal, or any combination thereof.

The alkali metal-containing compound may include: an alkali metal oxide, such as $Li_2O$, $Cs_2O$, $K_2O$, and/or the like; alkali metal halides, such as LiF, NaF, CsF, KF, LiI, NaI, CsI, KI, and/or the like; or any combination thereof. The alkaline earth metal-containing compound may include an alkaline earth metal compound, such as BaO, SrO, CaO, $Ba_xSr_{1-x}O$ (wherein x is a real number satisfying $0<x<1$), $Ba_xCa_{1-x}O$ (wherein x is a real number satisfying $0<x<1$), and/or the like. The rare earth metal-containing compound may include $YbF_3$, $ScF_3$, $SC_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include i) one selected from ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

In an embodiment, the electron injection layer may include or consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In an embodiment, the electron injection layer may include or consist of i) an alkali metal-containing compound (for example, alkali metal halide), ii) a) an alkali metal-containing compound (for example, alkali metal halide); and b) an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and/or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

The thickness of the electron injection layer may be in a range of about 1 Å to about 100 Å, and, for example, about 3 Å to about 90 Å. When the thickness of the electron injection layer is within the ranges above, suitable or satisfactory electron injection characteristics may be obtained without a substantial increase in driving voltage.

Second Electrode 124

The second electrode 124 may be located on the interlayer 123 having such a structure. The second electrode 124 may be a cathode, which is an electron injection electrode, and as the material for the second electrode 124, a metal, an alloy, an electrically conductive compound, or any combination thereof, each having a low work function, may be used.

The second electrode 124 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 124 may be a transmissive electrode, a semi-transmissive electrode, or a reflective electrode.

The second electrode 124 may have a single-layered structure or a multi-layered structure including two or more layers.

Capping Layer

A first capping layer may be located outside the first electrode 122, and/or a second capping layer may be located outside the second electrode 124. In more detail, the light-emitting device 120 may have a structure in which the first capping layer, the first electrode 122, the interlayer 123, and the second electrode 124 are sequentially stacked in this stated order, a structure in which the first electrode 122, the interlayer 123, the second electrode 124, and the second capping layer are sequentially stacked in this stated order, or a structure in which the first capping layer, the first electrode 122, the interlayer 123, the second electrode 124, and the second capping layer are sequentially stacked in this stated order.

Light generated in an emission layer of the interlayer 123 of the light-emitting device 120 may be extracted toward the outside through the first electrode 122, which is a semi-transmissive electrode or a transmissive electrode, and the first capping layer or light generated in an emission layer of the interlayer 123 of the light-emitting device 120 may be extracted toward the outside through the second electrode 124, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 120 is increased, so that the luminescence efficiency of the light-emitting device 120 may be improved.

Each of the first capping layer and the second capping layer may include a material having a refractive index of greater than or equal to 1.6 (at a wavelength of 589 nm).

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof. In an embodiment, at least one selected from the first capping layer and the second capping layer may each independently include an amine group-containing compound.

In one or more embodiments, at least one selected from the first capping layer and the second capping layer may each independently include a compound represented by Formula 201, a compound represented by Formula 202, or any combination thereof.

Manufacturing Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, laser-induced thermal imaging, and the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed and the structure of a layer to be formed.

Definition of Terms

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed together with each other. For example, the number of ring-forming atoms of the $C_1$-$C_{60}$ heterocyclic group may be from 3 to 61.

The "cyclic group" as used herein may include both the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a T1 group or ii) a condensed cyclic group in which two or more T1 groups are condensed together with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which at least two T2 groups are condensed together with each other, or iii) a condensed cyclic group in which at least one T2 group and at least one T1 group are condensed together with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), the π electron-rich $C_3$-$C_{60}$ cyclic group may be i) a T1 group, ii) a condensed cyclic group in which at least two T1 groups are condensed together with each other, iii) a T3 group, iv) a condensed cyclic group in which at least two T3 groups are condensed together with each other, or v) a condensed cyclic group in which at least one T3 group and at least one T1 group are condensed together with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and/or the like), the π electron-deficient nitrogen-containing $C_1$-$C_{60}$ cyclic group may be i) a T4 group, ii) a condensed cyclic group in which at least two T4 groups are condensed together with each other, iii) a condensed cyclic group in which at least one T4 group and at least one T1 group are condensed together with each other, iv) a condensed cyclic group in which at least one T4 group and at least one T3 group are condensed together with each other, or v) a condensed cyclic group in which at least one T4 group, at least one T1 group, and at least one T3 group are condensed together with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the TT electron-rich $C_3$-$C_{60}$ cyclic group, or the π electron-deficient nitrogen-containing $C_1$-$C_{60}$ cyclic group" as used herein refer to a group condensed to any suitable cyclic group, a monovalent group, or a polyvalent group (for example, a divalent group, a trivalent group, a tetravalent group, etc.) according to the structure of a formula for which the corresponding term is used. For example, the "benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, a butenyl group, and the like. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof are an ethynyl group, a propynyl group, and the like. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by $-OA_{101}$ (wherein $A_{101}$ is the $C_1$-$C_{60}$ alkyl group), and examples thereof are a methoxy group, an ethoxy group, an isopropyloxy group, and the like.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group of 1 to 10 carbon atoms, further including, in addition to carbon atoms, at least one heteroatom, as ring-forming atoms, and examples thereof are a 1,2,3,4-oxatriazolidinyl group, a tetrahydrofuranyl group, a tetrahydrothiophenyl group, and the like. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity (e.g., is not aromatic), and examples thereof are a cyclopentenyl group, a cyclohexenyl group, a cycloheptenyl group, and the like. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group are a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each include two or more rings, the rings may be condensed together with each other.

The term "$C_1$-$C_{60}$ heteroaryl group" as used herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein refers to a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed together with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure (e.g., is not aromatic when considered as a whole). Examples of the monovalent non-aromatic condensed polycyclic group are an indenyl group, a fluorenyl group, a spiro-bifluorenyl group, a benzofluorenyl group, an indenophenanthrenyl group, an indeno anthracenyl group, and the like. The term "divalent non-aromatic condensed polycyclic group" as used herein refers to a divalent group having substantially the same structure as the monovalent non-aromatic condensed polycyclic group described above.

The term "monovalent non-aromatic condensed heteropolycyclic group" as used herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure (e.g., is not aromatic when considered as a whole). Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group described above.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_7$-$C_{60}$ arylalkyl group" as used herein refers to -$A_{104}A_{105}$ (wherein $A_{104}$ is a $C_1$-$C_{54}$ alkylene group, and $A_{105}$ is a $C_6$-$C_{59}$ aryl group), and the term "$C_2$-$C_{60}$ heteroarylalkyl group" as used herein refers to —$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, $Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any suitable atom other than a carbon atom. Examples of the heteroatom are O, S, N, P, Si, B, Ge, Se, and any combination thereof.

The term "the third-row transition metal" used herein includes hafnium (Hf), tantalum (Ta), tungsten (W), rhenium (Re), osmium (Os), iridium (Ir), platinum (Pt), gold (Au), etc.

"Ph" as used herein refers to a phenyl group, "Me" as used herein refers to a methyl group, "Et" as used herein refers to an ethyl group, "ter-Bu" or "But" as used herein refers to a tert-butyl group, and "OMe" as used herein refers to a methoxy group.

The term "biphenyl group" as used herein refers to "a phenyl group substituted with a phenyl group." In other words, the "biphenyl group" may be a substituted phenyl group having a $C_6$-$C_{60}$ aryl group as a substituent.

The term "terphenyl group" as used herein refers to "a phenyl group substituted with a biphenyl group." In other words, the "terphenyl group" may be a substituted phenyl group having, as a substituent, a $C_6$-$C_{60}$ aryl group substituted with a $C_6$-$C_{60}$ aryl group.

The maximum number of carbon atoms in this substituent definition section is an example only. In an embodiment, the maximum carbon number of 60 in the $C_1$-$C_{60}$ alkyl group is an example, and the definition of the alkyl group is equally applied to a $C_1$-$C_{20}$ alkyl group. The same applies to other cases.

* and *' as used herein, unless defined otherwise, each refer to a binding site to a neighboring atom in a corresponding formula.

Hereinafter, manufacture of a display apparatus according to an embodiment and evaluation results thereof will be described with reference to Examples.

Preparation of First Scatterer $TiO_2$ particles having a diameter of 250 nm were coated with a dispersant-type compound to prepare a first scatterer of which a surface is hydrophilic. The dispersant-type compound is a polymer including both an amine group and a carboxyl group and having a difference between an amine value and an acid value of 80 mg KOH/g (weight average molecular weight: 800 to 20,000).

Preparation of Second Scatterer $TiO_2$ particles having a diameter of 170 nm were coated with a dispersant-type compound to prepare a second scatterer of which a surface is hydrophobic. The dispersant-type compound is a polymer including both an amine group and a carboxyl group and having a difference between an amine value and an acid value of 10 mg KOH/g (weight average molecular weight: 1,000 to 30,000).

Example 1: Preparation of Red Quantum Dot Ink Composition 35 wt % of 1,6-hexanediol diacrylate as a monomer, 50 wt % of Ag—In—Ga—S for red quantum dots, 1 wt % of the first scatterer, 9 wt % of the second scatterer, 0.1 wt % of TPO, and 4.9 wt % of a viscosity modifier were mixed together to prepare a red quantum dot ink composition.

Example 2: Preparation of Green Quantum Dot Ink Composition 35 wt % of 1,6-hexanediol diacrylate as a monomer, 50 wt % of Ag—In—Ga—S for green quantum dots, 1 wt % of the first scatterer, 9 wt % of the second scatterer, 0.1 wt % of TPO, and 4.9 wt % of a viscosity modifier were mixed together to prepare a green quantum dot ink composition.

Example 3: Preparation of Scatterer Ink Composition 35 wt % of 1,6-hexanediol diacrylate as a monomer, 1 wt % of the first scatterer, 59 wt % of the second scatterer, 0.1 wt % of TPO as an initiator, and 4.9 wt % of a viscosity modifier were mixed together to prepare a scatterer quantum dot ink composition.

Example 4

As shown in FIG. 2, first, the light-emitting device 120 was formed on the first substrate 110 as shown in FIG. 3A, and then covered by a thin-film encapsulation layer 130. The emission layer included in the interlayer 123 of the light-emitting device 120 formed a blue emission layer as a common layer.

Next, as shown in FIG. 3B, the color filter layers 220R, 220G, and 220B were formed at positions corresponding to the respective light-emitting devices 120 on the second substrate 210, wherein, on some regions, the color filter layers 220R, 220G, and 220B overlapped to function as a black matrix.

Next, as shown in FIG. 3C, a hollow silica material was applied to the color filter layers 220R, 220G, and 220B to form the low refractive index layer 260 on the color filter layers 220R, 220G, and 220B. Then, on the low refractive index layer 260, the bank 240 was patterned on a region where the color filter layers 220R, 220G, and 220B overlapped such that the bank 240 may remain for each position between the color filter layers 220R, 220G, and 220B between each pixel. Here, the surfaces of the bank 240 facing each other were hydrophilic.

Afterwards, as shown in FIG. 3D, the red quantum dot ink composition of Example 1 was applied to a red pixel to form the quantum dot layer 230R by an inkjet process, and the green quantum dot ink composition of Example 2 was applied to a green pixel to form the green quantum dot layer 230G. The scattering layer 230W was formed on a blue pixel by using the scatterer ink composition.

Because the first scatterer was hydrophilic and the surfaces of the bank 240 facing each other were also hydrophilic, the first scatterer moved to the surface of the bank 240 as shown in FIG. 1 so that the surface of the bank 240 was coated. Meanwhile, the second scatterer maintained almost the same dispersed state at the time of first ink-jetting.

The quantum dot layers 230R and 230G and the scattering layer 230W formed by ink-jetting were irradiated with ultraviolet (UV) light (having a wavelength of 365 nm) for 4 seconds to cure the quantum dot layers 230R and 230G and the scattering layer 230W. Next, the quantum dot layers 230R and 230G and the scattering layer 230W were post-backed at 180° C. for 30 minutes in the air atmosphere.

Then, silicon nitride was coated thereon by a chemical vapor deposition (CVD) method to form the inorganic capping layer 270 having a thickness of 4,000 Å.

Subsequently, as shown in FIG. 3E, the filling material 300 was applied between the first and second substrates 110 and 210, and the two substrates 110 and 210 were bonded.

When the ink composition according to an embodiment was used, by one shot of the inkjet, the inner surface of the bank was coated with the scatterer so that the optical loss was reduced and the scatterer in the central portion of the quantum dot layer (or the scattering layer) maintained the initial suitable or optimum concentration of the scatterer. Accordingly, it was confirmed that the display apparatus operated with excellent efficiency.

Although the subject matter of the present disclosure is described with reference to the embodiments above, these are only examples, and those skilled in the art will understand that various suitable modifications and variations of the disclosed embodiments are possible therefrom. Accordingly, the true scope of the present disclosure should be determined by the appended claims, and equivalents thereof.

According to one or more embodiments, an ink composition according to an embodiment can, by a single process, reduce optical loss by coating a bank surface with a scatterer and also maintain suitable or optimal concentration and uniformity by evenly (e.g., substantially evenly) distributing the scatterer in the quantum dot layer and/or the scattering layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope of the present disclosure as defined by the following claims, and equivalents thereof.

What is claimed is:

1. An ink composition comprising:

a scatterer; and a monomer, wherein the scatterer comprises a first scatterer and a second scatterer, and the first scatterer is hydrophilic, and the second scatterer is hydrophobic, wherein:

the first scatterer is a scatterer in which a first ligand-type compound or a first dispersant-type compound is coated on the scattering particle, the first ligand-type compound:

comprises an amine group, but not a carboxyl group;

comprises not an amine group, but a carboxyl group; or comprises both an amine group and a carboxyl group, wherein a difference between an amine value and an acid value is 5 mg KOH/g or more, the first dispersant-type compound comprising a polymer chain comprising a polyacrylate-based polymer, a polyurethane-based polymer, and/or a polyethylene-based polymer, the polymer chain:

comprises an amine group, but not a carboxyl group;

comprises not an amine group, but a carboxyl group; or comprises both an amine group and a carboxyl group, wherein a difference between an amine value and an acid value is 5 mg KOH/g or more, wherein the amine value is a converted mg value of KOH after neutralization titration of an amine group included in 1 g of the compound with HCl, and the acid value is an mg value of KOH required for neutralization titration the carboxyl group included in 1 g of the compound with KOH.

2. The ink composition of claim 1, wherein the second scatterer is a scatterer in which a ligand-type compound or a dispersant-type compound is coated on a scattering particle.

3. The ink composition of claim 2, wherein the scattering particle comprises a metallic compound.

4. The ink composition of claim 2, wherein the scattering particle comprises $Al_2O_3$, $SiO_2$, ZnO, $ZrO_2$, $BaTiO_3$, $TiO_2$, $Ta_2O_5$, $Ti_3O_5$, ZnO—Al, $Nb_2O_3$, SnO, MgO, $MgF_2$, or any combination thereof.

5. The ink composition of claim 1, wherein a total amount of the scatterer is in a range of about 1 wt % to about 70 wt %, based on 100 wt % of the total amount of the ink composition.

6. The ink composition of claim 1, wherein an amount of the first scatterer is in a range of about 0.1 wt % to about 5 wt %, and an amount of the second scatterer is in a range of about 7 wt % to about 60 wt %, based on 100 wt % of the total amount of the ink composition.

7. The ink composition of claim 1, wherein an amount of the second scatterer is in a range of about 0.1 wt % to about 5 wt %, and an amount of the first scatterer is in a range of about 7 wt % to about 60 wt %, based on 100 wt % of the total amount of the ink composition.

8. The ink composition of claim 1, further comprising a quantum dot.

9. The ink composition of claim 8, wherein the quantum dot comprises: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

10. The ink composition of claim 9, wherein the Group II-VI semiconductor compound comprises CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, or any combination thereof.

11. The ink composition of claim 9, wherein:

the Group III-V semiconductor compound comprises GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the Group III-VI semiconductor compound comprises GaS, GaSe, $GazSe_3$, GaTe, InS, InSe, $In_2S_3$, $In_2Se_3$, InTe, $InGaS_3$, $InGaSe_3$, or any combination thereof.

12. The ink composition of claim 9, wherein:

the Group I-III-VI semiconductor compound comprises AgInS, $AgInS_2$, CuInS, $CuInS_2$, $CuGaO_2$, $AgGaO_2$, $AgAlO_2$, AgInGaS, or any combination thereof, the Group IV-VI semiconductor compound comprises SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, or any combination thereof, and the Group IV element or compound comprises Si, Ge, SiC, SiGe, or any combination thereof.

13. A layer prepared by the ink composition of claim 1.

14. A display apparatus comprising:

a first substrate on which a light-emitting device is provided; and a light controller on the first substrate and corresponding to the light-emitting device, wherein the light controller comprises: a quantum dot layer and/or a scattering layer; a color filter layer; and a bank, and the quantum dot layer and/or the scattering layer is a layer obtained by the ink composition of claim 1.

15. The display apparatus of claim 14, wherein:

the quantum dot layer and/or the scattering layer is in contact with the bank, a surface of the bank in contact with the quantum dot layer and/or the scattering layer is hydrophilic, and in the quantum dot layer and/or the scattering layer, an amount of the first scatterer is in a range of about 0.1 wt % to about 5 wt %, and an amount of the second scatterer is in a range of about 7 wt % to about 60 wt %, based on 100 wt % of the total amount of the ink composition.

16. The display apparatus of claim 14, wherein:

the quantum dot layer and/or the scattering layer is in contact with the bank, a surface of the bank in contact with the quantum dot layer and/or the scattering layer is hydrophobic, and in the quantum dot layer and/or the scattering layer, an amount of the second scatterer is in a range of about 0.1 wt % to about 5 wt %, and an amount of the first scatterer is in a range of about 7 wt % to about 60 wt %, based on 100 wt % of the total amount of the ink composition.

17. The display apparatus of claim 14, wherein:

the light-emitting device comprises:

a first electrode; a second electrode facing the first electrode; and an interlayer between the first electrode and the second electrode and comprising an emission layer.

18. The display apparatus of claim 17, wherein:

the interlayer further comprises:

a hole transport region comprising a hole injection layer, a hole transport layer, an emission auxiliary layer, an electron blocking layer, or any combination thereof, and/or an electron transport region comprising a hole blocking layer, an electron transport layer, an electron injection layer, or any combination thereof.

19. An ink composition comprising:

a scatterer; and a monomer, wherein the scatterer comprises a first scatterer and a second scatterer, and the first scatterer is hydrophilic, and the second scatterer is hydrophobic, wherein:

the second scatterer is a scatterer in which a second ligand-type compound or a second dispersant-type compound is coated on the scattering particle, the second ligand-type compound:

does not comprise an amine group and a carboxyl group; or comprises both an amine group and a carboxyl group, wherein a difference between an amine value and an acid value is in a range of about 0 mg KOH/g to about 20 mg KOH/g, the second dispersant-type compound comprises a polymer chain comprising a polyacrylate-based polymer, a polyurethane-based polymer, or a polyethylene-based polymer, the polymer chain:

does not comprise an amine group and a carboxyl group; or comprises both an amine group and a carboxyl group, wherein a difference between an amine value and an acid value is in a range of about 0 mg KOH/g to about 20 mg KOH/g, wherein the amine value is a converted mg value of KOH after neutralization titration of an amine group included in 1 g of the compound with HCl, and the acid value is an mg value of KOH required for neutralization titration the carboxyl group included in 1 g of the compound with KOH.

* * * * *